(12) United States Patent
Wang et al.

(10) Patent No.: US 7,319,630 B2
(45) Date of Patent: Jan. 15, 2008

(54) CURRENT-LIMITED LATCH

(75) Inventors: Chi-Ming Wang, Fremont, CA (US);
Kuo-Lung Chen, Saratoga, CA (US);
Shouchang Tsao, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/019,990

(22) Filed: Dec. 20, 2004

(65) Prior Publication Data

US 2005/0101236 A1 May 12, 2005

Related U.S. Application Data

(63) Continuation of application No. 10/313,738, filed on Dec. 6, 2002.

(51) Int. Cl.
*G11C 7/00* (2006.01)

(52) U.S. Cl. ............. 365/226; 365/185.11; 365/230.08

(58) Field of Classification Search ........... 365/185.11, 365/89.11, 230.08, 189.05, 226
See application file for complete search history.

(56) References Cited

U.S. PATENT DOCUMENTS

| | | | |
|---|---|---|---|
| 4,342,102 A * | 7/1982 | Puar | 365/185.21 |
| 5,095,344 A | 3/1992 | Harari | |
| 5,270,979 A | 12/1993 | Harari et al. | |
| 5,278,785 A | 1/1994 | Hazani | |
| 5,313,432 A | 5/1994 | Lin et al. | 365/230.06 |
| 5,334,890 A * | 8/1994 | Hardee | 365/207 |
| 5,380,672 A | 1/1995 | Yuan et al. | |
| 5,602,987 A | 2/1997 | Harari et al. | |
| 5,668,758 A | 9/1997 | Kamei et al. | |
| 5,712,180 A | 1/1998 | Guterman et al. | |
| 5,745,410 A * | 4/1998 | Yiu et al. | 365/185.3 |
| 5,777,924 A | 7/1998 | Lee et al. | 365/185.11 |
| 5,991,517 A | 11/1999 | Harari et al. | |
| 6,005,802 A | 12/1999 | Takeuchi et al. | |
| 6,104,665 A | 8/2000 | Ho et al. | |
| 6,222,762 B1 | 4/2001 | Guterman et al. | |
| 6,230,233 B1 | 5/2001 | Lofgren et al. | |
| 6,285,578 B1 | 9/2001 | Huang | |

(Continued)

FOREIGN PATENT DOCUMENTS

EP 1152538 A1 11/2001

OTHER PUBLICATIONS

"Notification of Transmittal of the International Search Report or the Declaration", corresponding PCT application No. PCT/US03/38328, International Searching Authority, European Patent Office, Jan. 18, 2005, 10 pages.

(Continued)

*Primary Examiner*—Thong Q. Le
(74) *Attorney, Agent, or Firm*—Winston & Strawn LLP

(57) ABSTRACT

A current-limited latch circuit is used within a nonvolatile memory integrated circuit for decoding, programming, erase, and other operations. In one implementation, there are a number of latches connected together in parallel between two power supply lines. A current mirroring scheme limits current supplied to the latch. This reduces a difference of the two supplies, positive voltage, ground, or negative voltages, during data changes. The circuit provides smaller device sizes and fast speeds when data changes in the latch, while also providing lower power consumption. The technique provides greater benefits as the voltage difference between the two power supplies is greater.

14 Claims, 11 Drawing Sheets

U.S. PATENT DOCUMENTS

| | | | |
|---|---|---|---|
| RE37,419 E | 10/2001 | Hsu et al. | |
| 6,356,481 B1 | 3/2002 | Micheloni et al. | |
| 6,380,636 B1 | 4/2002 | Tatsukawa et al. | |
| 6,445,621 B1 | 9/2002 | Heightley | |
| 6,580,629 B2 | 6/2003 | Ogata | |
| 6,639,824 B1 | 10/2003 | Wohlfahrt et al. | |
| 6,704,241 B1 | 3/2004 | Ha | |
| 6,806,525 B2 | 10/2004 | Takeuchi et al. | |
| 6,818,937 B2 | 11/2004 | Noble et al. | |
| 6,871,258 B2 | 3/2005 | Micheloni et al. | |
| 7,042,752 B2 * | 5/2006 | Okuda | 362/112 |
| 2001/0050877 A1 | 12/2001 | Origasa | |
| 2002/0008279 A1 | 1/2002 | Ooishi et al. | |
| 2002/0015344 A1 | 2/2002 | Leung et al. | |
| 2002/0031029 A1 | 3/2002 | Ogata | |
| 2002/0149048 A1 | 10/2002 | Noble et al. | |
| 2003/0028709 A1 | 2/2003 | Micheloni et al. | |
| 2003/0067804 A1 | 4/2003 | Guaitini et al. | |
| 2004/0047224 A1 | 3/2004 | Ha | |
| 2004/0070021 A1 | 4/2004 | Menz | |
| 2005/0109354 A1 | 5/2005 | Wang et al. | 451/538 |

OTHER PUBLICATIONS

"Communication Relating to the Results of the Partial International Search", corresponding PCT application No. PCT/US03/38328, International Searching Authority, European Patent Office, Jan. 6, 2004, 5 pages.

Office Action for U.S. Appl. No. 10/313,738 mailed Aug. 4, 2006, 8 pages.

Partial International Search Report, mailed in corresponding International Patent Application No. PCT/US03/38328 on Jun. 1, 2004, 5 pages.

USPTO, "Office Action," mailed in parent U.S. Appl. No. 10/313,738, filed Apr. 2, 2007, 6 pages.

USPTO, "Office Action," mailed in parent U.S. Appl. No. 10/313,738, filed Dec. 6, 2006, 7 pages.

USPTO, "Office Action," mailed in parent U.S. Appl. No. 10/313,738, filed on Jan. 20, 2006, 10 pages.

USPTO, "Office Action," mailed in parent U.S. Appl. No. 10/313,738, filed Aug. 8, 2005, 10 pages.

USPTO, "Office Action," mailed in parent U.S. Appl. No. 10/313,738, filed on Mar. 16, 2005, 8 pages.

USPTO, "Notice of Allowance," mailed in parent U.S. Appl. No. 10/313,738, filed Sep. 21, 2004, 6 pages.

USPTO, "Office Action," mailed in parent U.S. Appl. No. 10/313,738, filed on Apr. 19, 2004, 6 pages.

USPTO, "Office Action," mailed in parent U.S. Appl. No. 10/313,738, filed on Dec. 17, 2003, 6 pages.

European Patent Office, Substantive Examination Report mailed in corresponding European Patent Application No. 03 812 793.2 on Jul. 2, 2007, 3 pages.

USPTO, Notice of Allowance mailed in parent U.S. Appl. No. 10/313,738, filed on Sep. 5, 2007, 7 pages.

* cited by examiner

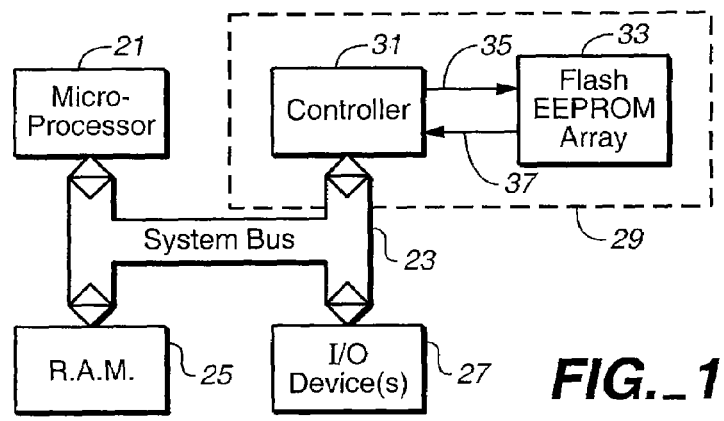
FIG._1
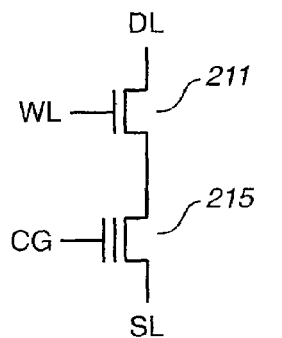
FIG._2A
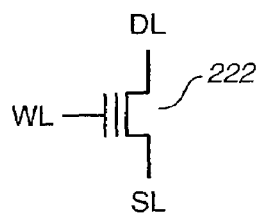
FIG._2B
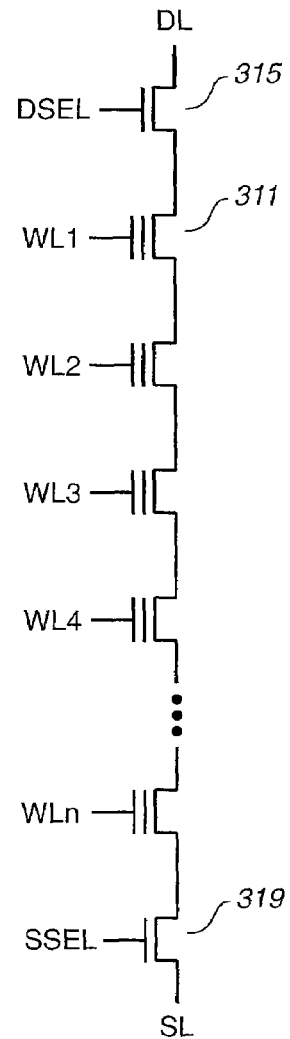
FIG._3

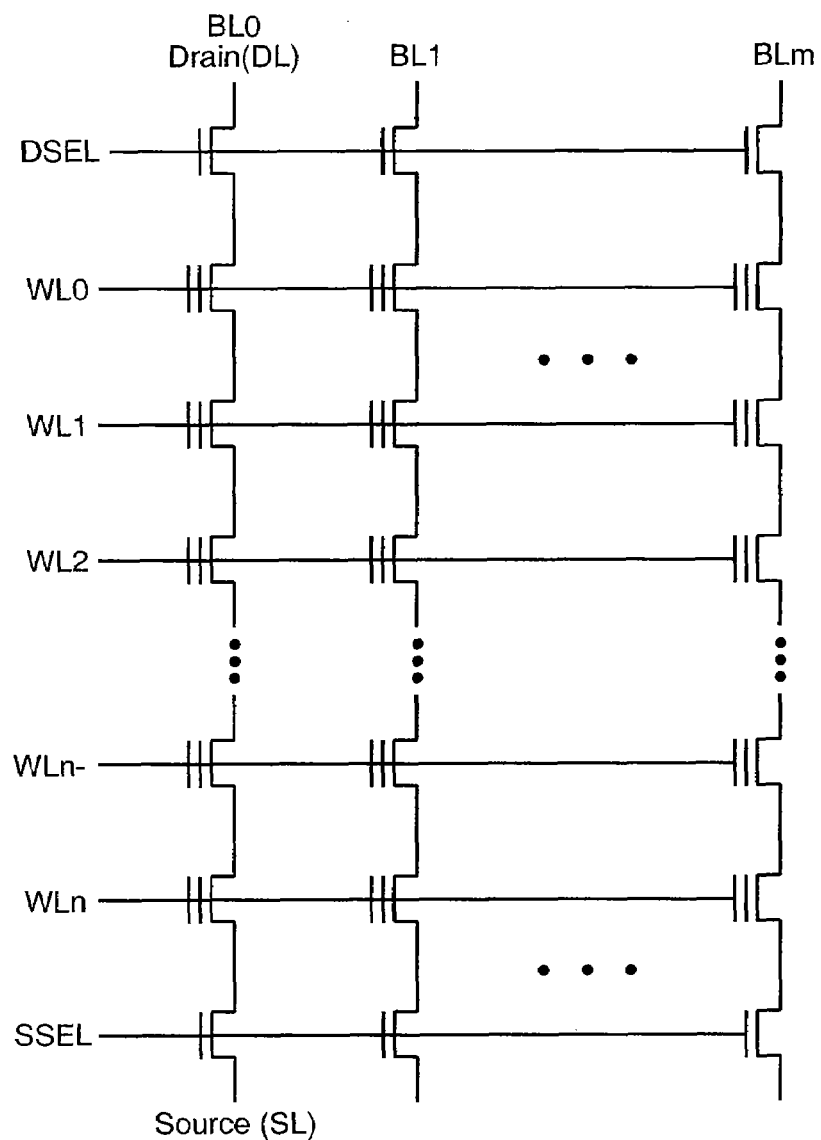
FIG._4
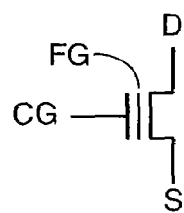
FIG._5

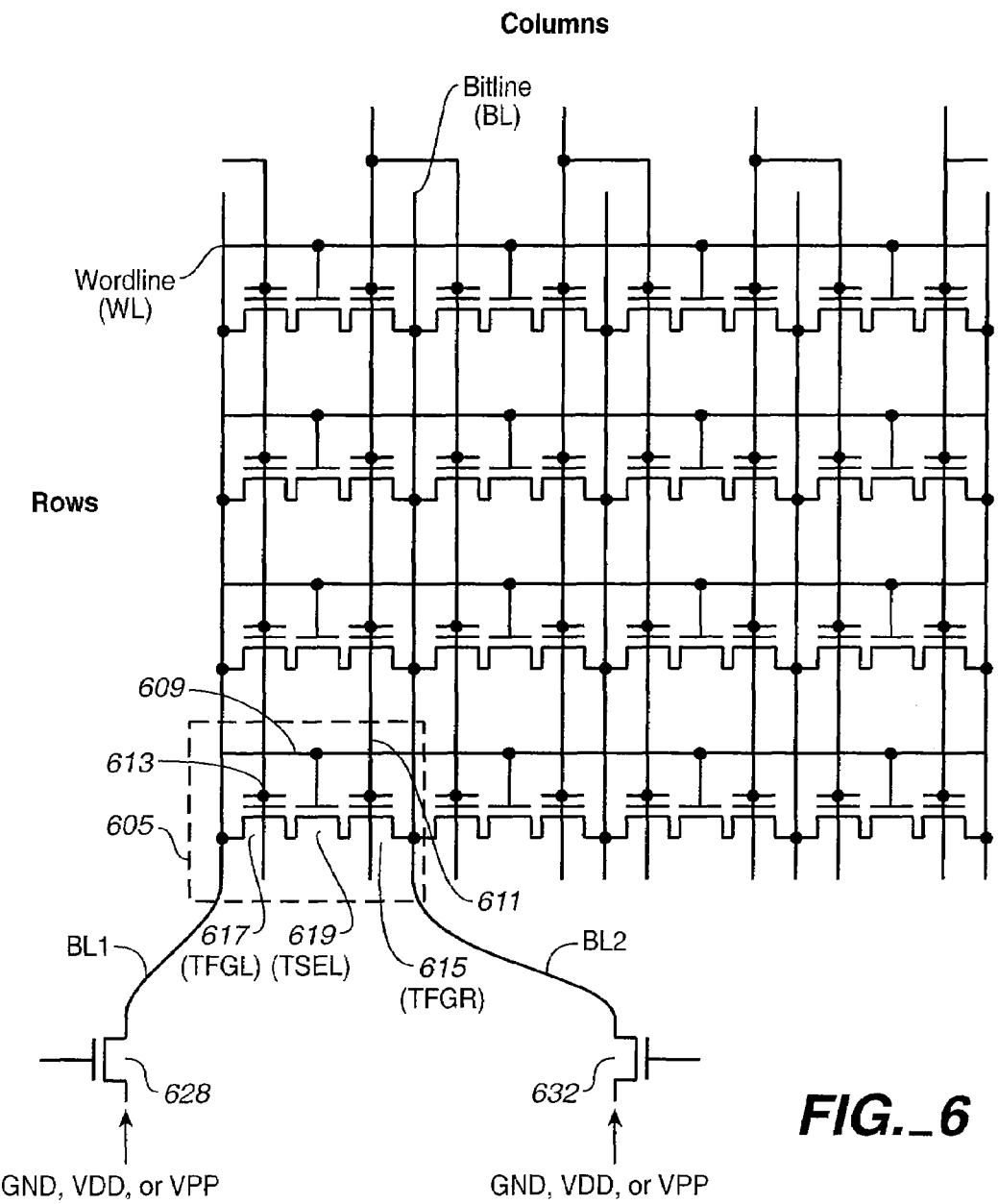
FIG._6

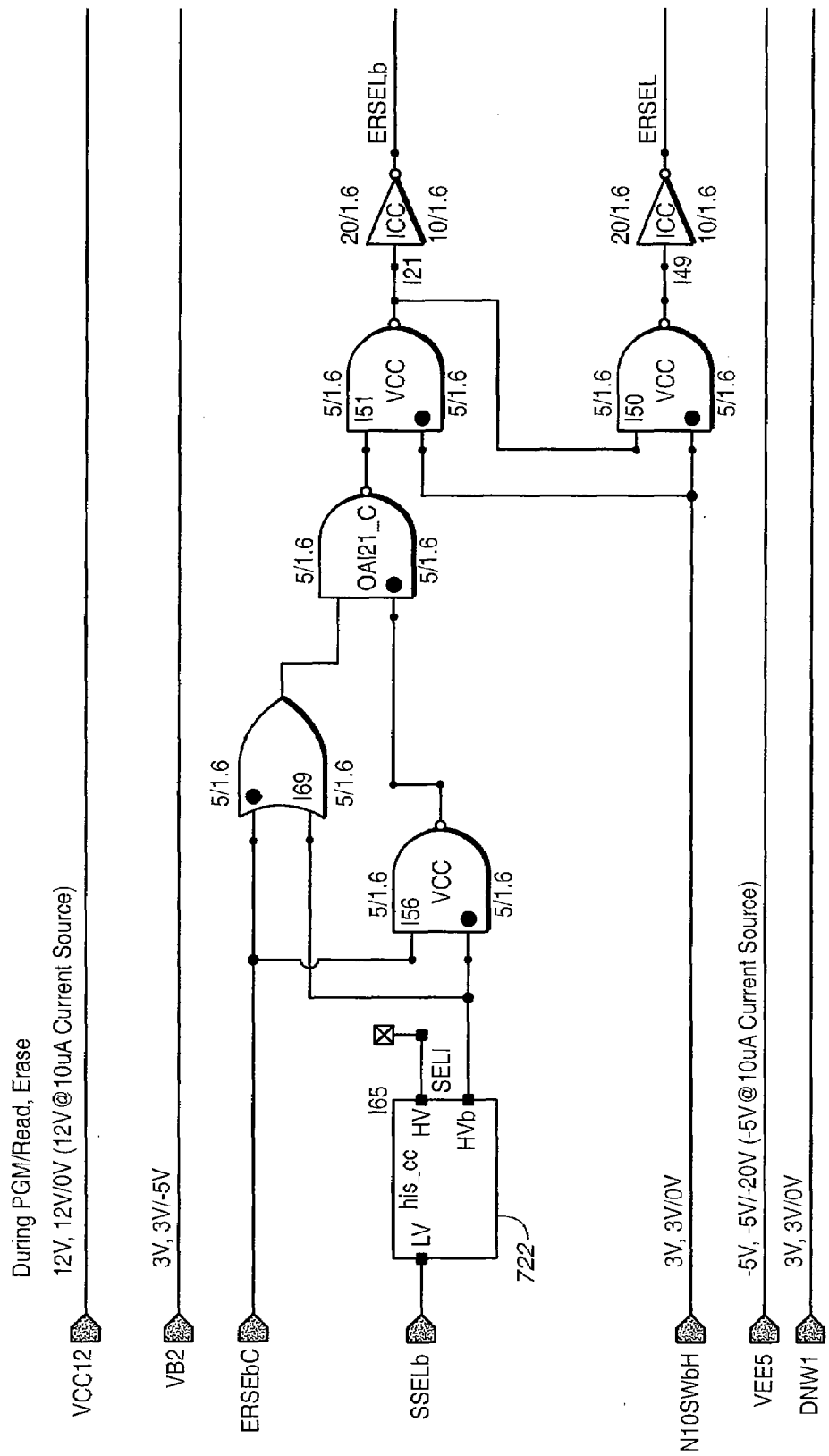
FIG._7A

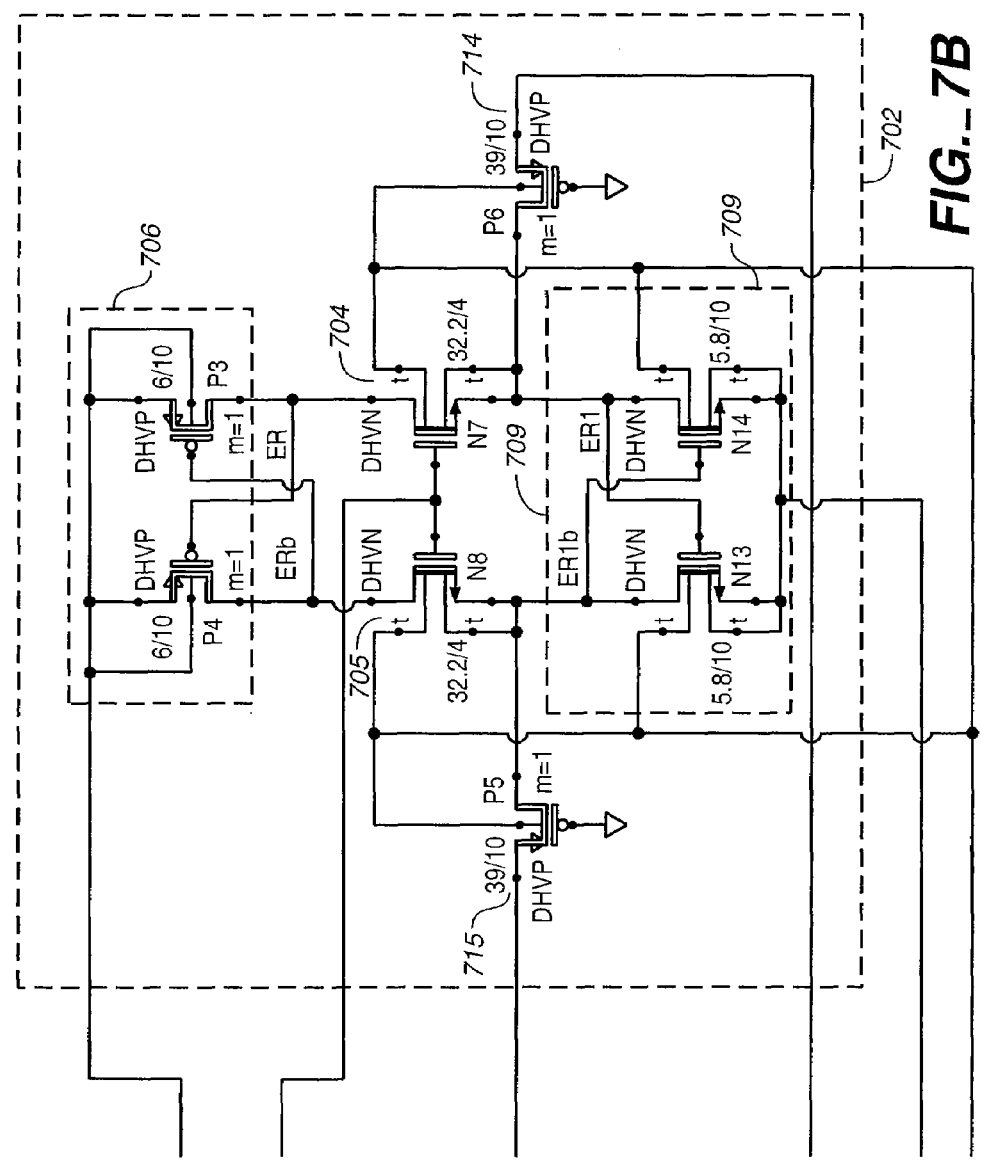

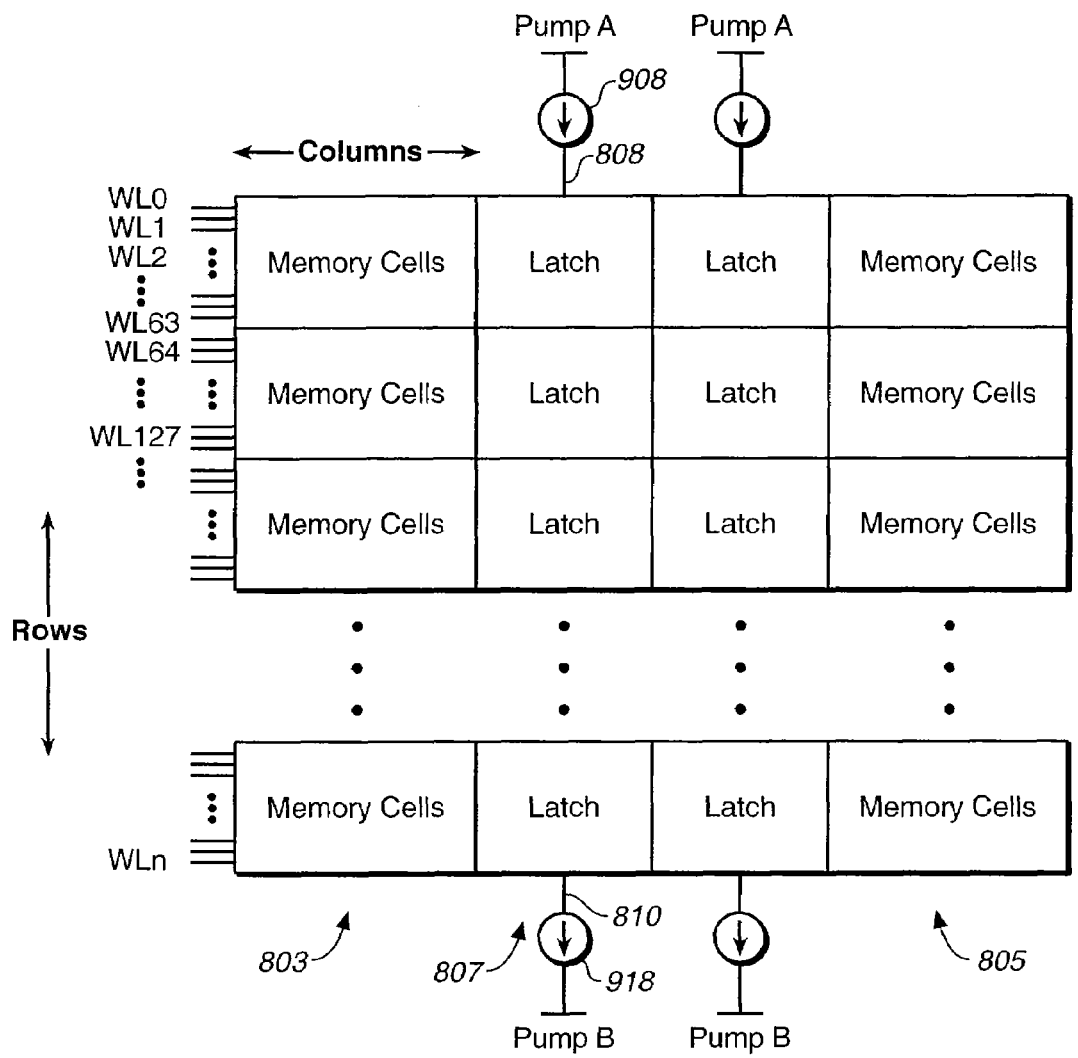
FIG._8
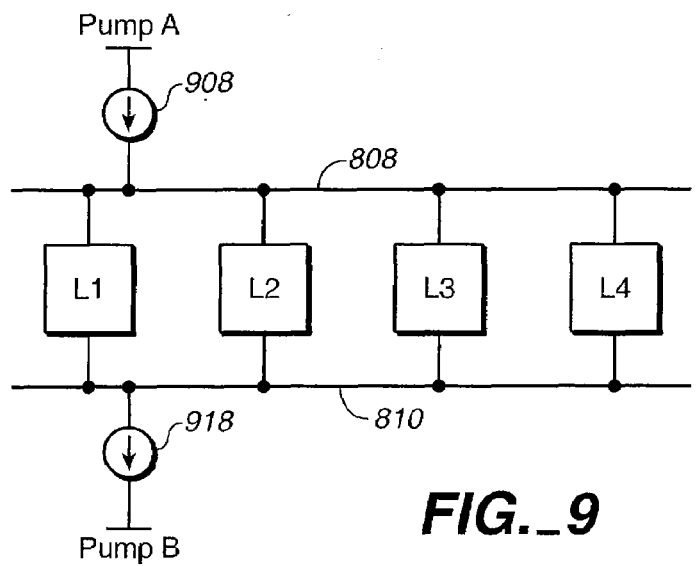
FIG._9

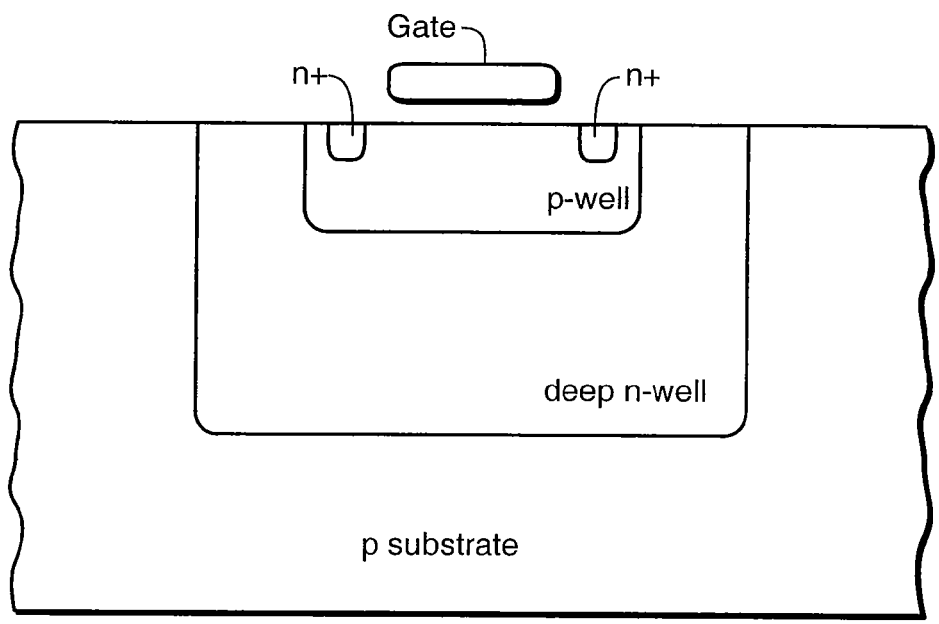
FIG._10
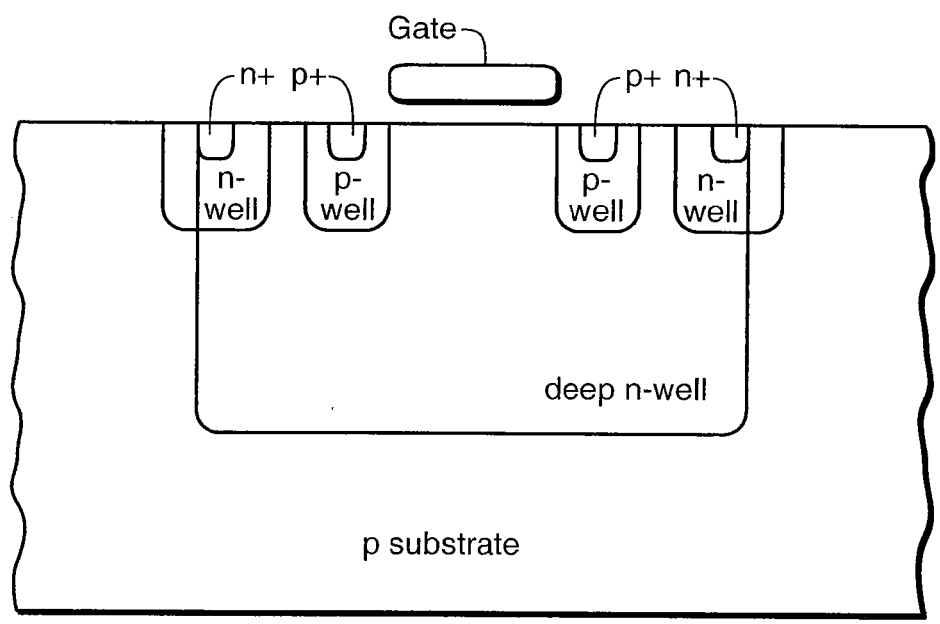
FIG._11

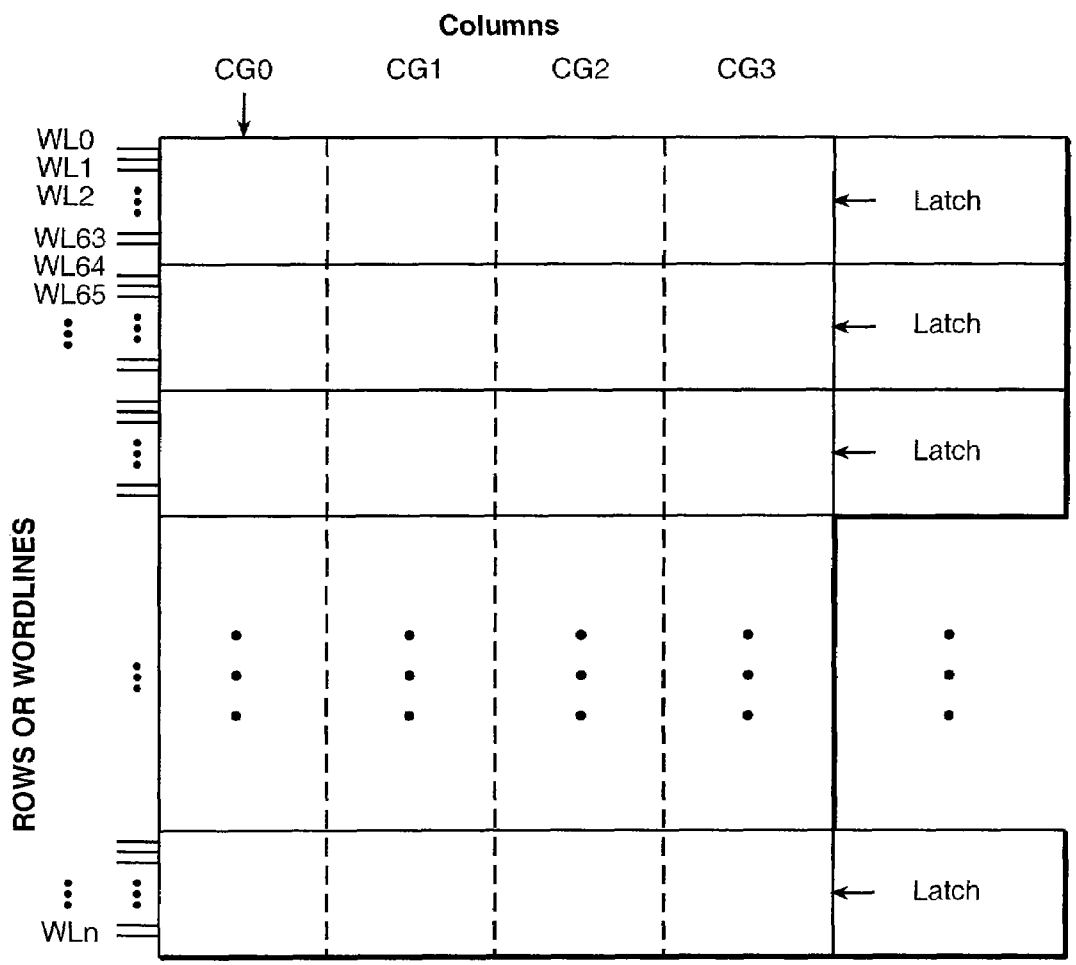
FIG._12

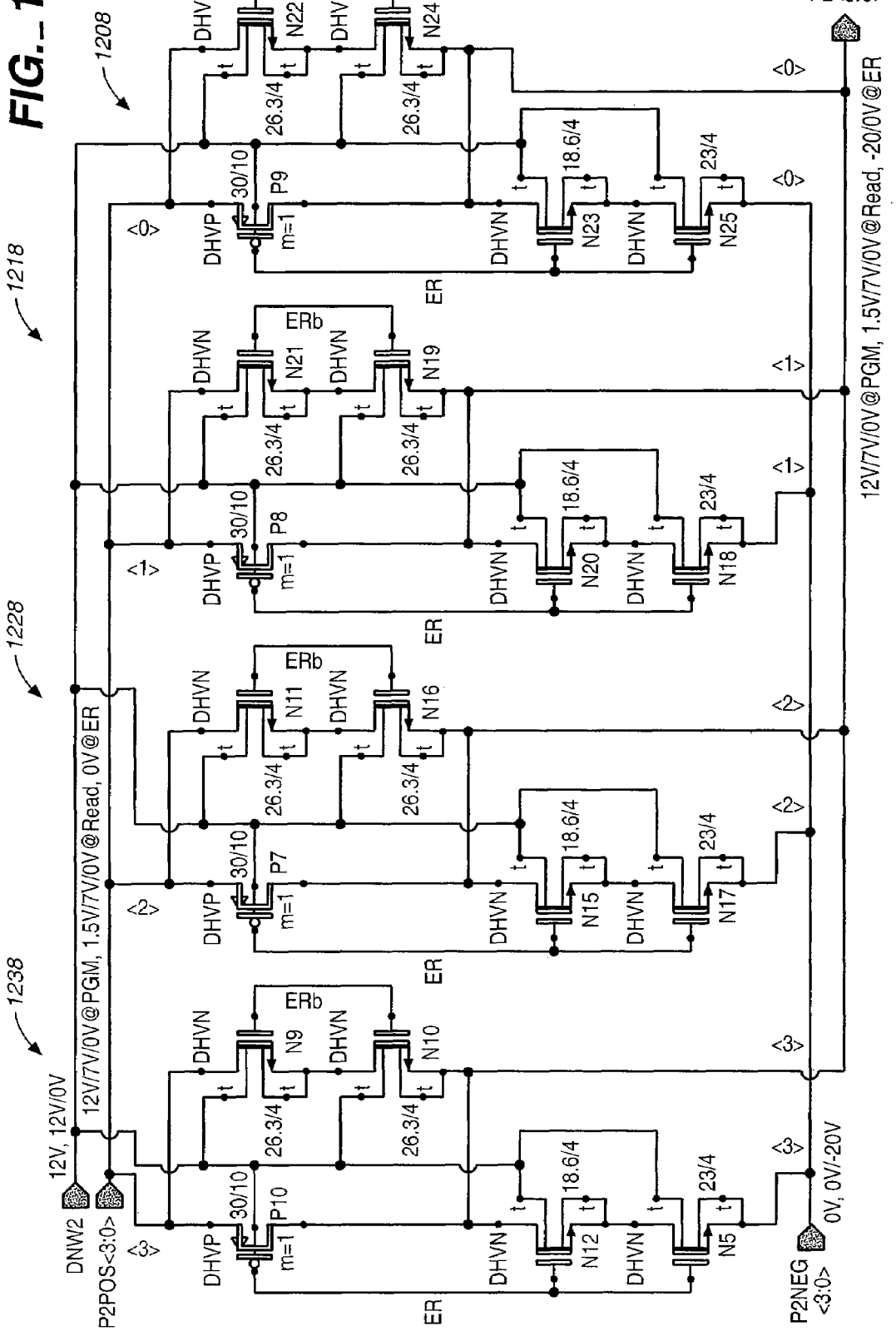
FIG._13

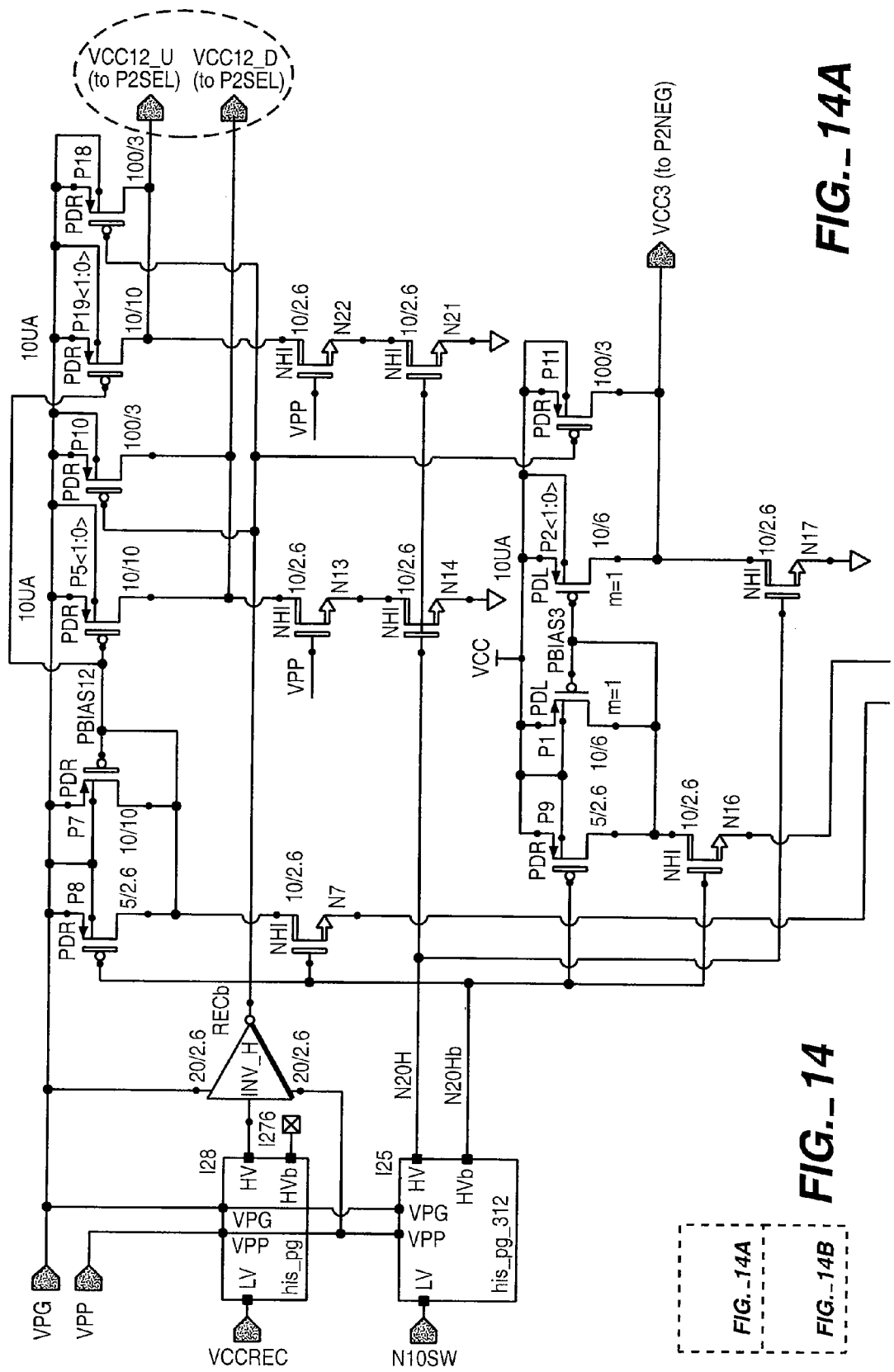
FIG._14A
FIG._14

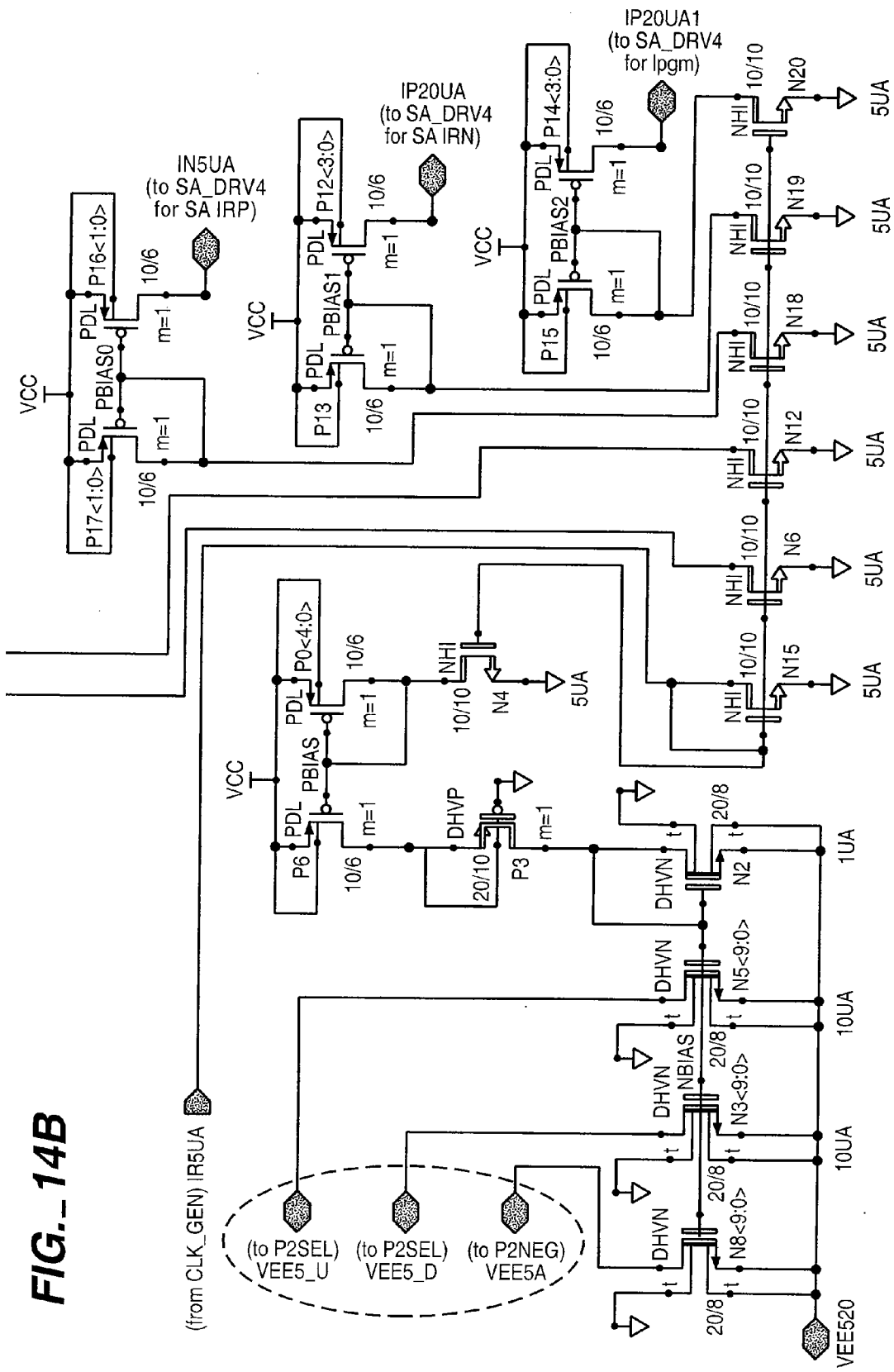
FIG._14B

CURRENT-LIMITED LATCH

CROSS-REFERENCE TO RELATED APPLICATIONS

This application is a continuation of U.S. patent application Ser. No. 10/313,738, filed Dec. 6, 2002, which application is incorporated herein in its entirety by this reference.

BACKGROUND OF THE INVENTION

The present invention relates to programming of nonvolatile erasable programmable memories and more specifically, a technique to more rapidly program these memory cells by applying a bias voltage to source nodes of the memory cells.

Memory and storage is one of the key technology areas that is enabling the growth in the information age. With the rapid growth in the Internet, World Wide Web (WWW), wireless phones, personal digital assistants (PDAs), digital cameras, digital camcorders, digital music players, computers, networks, and more, there is continually a need for better memory and storage technology.

A particular type of memory is the nonvolatile memory. A nonvolatile memory retains its memory or stored state even when power is removed. Some types of nonvolatile erasable programmable memories include Flash, EEPROM, EPROM, MRAM, FRAM, ferroelectric, and magnetic memories. Some nonvolatile storage products include Flash disk drives, CompactFlash™ (CF) cards, MultiMedia cards (MMC), secure digital (SD) cards, Flash PC cards (e.g., ATA Flash cards), SmartMedia cards, personal tags (P-Tag), and memory sticks.

A widely used type of semiconductor memory storage cell is the Flash memory cell. Some types of floating gate memory cells include Flash, EEPROM, and EPROM. There are other types of memory cell technologies such as those mentioned above. Floating gate memory cells such as Flash are discussed as merely an example. The discussion in this application would also apply to other memory technologies other than floating gate technology with the appropriate modifications.

Memory cells are configured or programmed to a desired configured state. In particular, electric charge is placed on or removed from the floating gate of a Flash memory cell to put the cell into two or more stored states. One state is a programmed state and another state is an erased state. A Flash memory cell can be used to represent at least two binary states, a 0 or a 1. A Flash memory cell can also store more than two binary states, such as a 00, 01, 10, or 11. This cell can store multiple states and may be referred to as a multistate memory cell, a multilevel, or multibit memory cell. This allows the manufacture of higher density memories without increasing the number of memory cells since each memory cell can represent more than a single bit. The cell may have more than one programmed state. For example, for a memory cell capable of representing two bits, there will be three programmed states and an erased state.

Despite the success of nonvolatile memories, there also continues to be a need to improve the technology. It is desirable to improve the density, performance, speed, durability, and reliability of these memories. It is also desirable to reduce power consumption and reduce the cost per bit of storage. One aspect of nonvolatile memories is the circuitry and techniques used to write or program data into the cells. Latch circuits may be used for this purpose. Conventional data latches are directly connected to power lines, VDD and VSS. However connecting these power supplies to latches may cause longer delay and more power consumptions. It is desirable that the circuitry provides the proper voltages to the cells to support the need operations, be compact in size, have low power consumption, and be relatively easy to adjust as needed.

As can be appreciated, there is a need for improving the circuitry and techniques for operating on memory cells.

SUMMARY OF THE INVENTION

The invention is a current-limited latch circuit, which may be used within a nonvolatile memory integrated circuit for decoding, programming, erase, and other operations. In a specific implementation, there are a number of latches connected together in parallel between two power supply lines. The latch uses a current mirroring scheme to limit current supplied to the latch. This reduces a difference of the two supplies, positive voltage, ground, or negative voltages, during data changes. The circuit provides smaller device sizes and fast speeds when data changes in the latch, while also providing lower power consumption. The technique provides greater benefits as the voltage difference between the two power supplies is greater.

In one specific implementation, the invention is an integrated circuit including an array of nonvolatile memory cells arranged in rows and columns and a plurality of latch circuits. The memory cells may include Flash, EEPROM, EPROM, floating gate, HE, or DFGSSI cells. The latch circuits are connected to the array of memory cells. The latch circuits are connected in parallel between a upper supply line and a lower supply line. Each latch circuit includes a upper pull-up circuit block connected to the upper supply line and a lower pull-down circuit block connected to the lower supply line. The supply lines are supplied by current-limited supplies, which may be generated on-chip. Further, in an embodiment, in a first mode, the upper supply line is placed at a positive voltage. In a second mode, the upper supply line is placed at a negative voltage and the lower supply line is also placed at a negative voltage, more negative than the upper supply line.

The upper pull-up circuit block includes a first p-channel transistor having a source connected to the upper supply line, a gate connected to a first node, and a source connected to a second node. The upper pull-up circuit block further includes a second p-channel transistor having a source connected to the upper supply line, a gate connected to the second node, and a source connected to the first node.

The lower pull-down circuit block includes a first n-channel transistor having a source connected to the lower supply line, a gate connected to a first node, and a source connected to a second node. The lower pull-down circuit block further includes a second n-channel transistor having a source connected to the lower supply line, a gate connected to the second node, and a source connected to the first node.

The latch includes a first n-channel transistor connected between a first and second node, and has a gate connected to a bias voltage line. The latch has a second n-channel transistor connected between a third and fourth node, and a gate connected to the bias voltage line. The first and second n-channel transistors may be deep n-well devices, each formed in a p-type diffusion tub that is within an n-well tub.

The latch may further include a first p-channel transistor connected between the second node and a fifth node, and a second p-channel transistor connected between the fourth node and a sixth node. During normal operation, the fifth node and sixth node provide complementary logic signals (in any voltage level). The p-channel transistors may be triple n-well devices, especially if negative supplies are used.

In embodiment, the upper supply line of the latch circuit is connected to a positive voltage source of 10 volts or greater and the lower supply line is connected to ground. During operation, a voltage difference between voltages at the upper supply line and lower supply lines may be about 10 volts or greater.

A voltage supplied to the upper supply line is generated by a first on-chip pump circuit, and a voltage supplied to the lower supply line is generated by a second on-chip pump circuit. The current from the upper supply line may be limited to about 10 microamps and a current to the lower supply line may be limited to about 10 microamps. The amount the current is limited by may be any level, and depends on the specific application or need. In other embodiments, the current limiter may limit to 100 microamps or less.

In a further embodiment, the invention is an integrated circuit having nonvolatile memory cells and a number of latches, one latch for each row of memory cells. The latch is laid out on a substrate of the integrated circuit in the same pitch as a row of memory cells. The latch may store positive and negative voltages.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 1 generally shows an electronic system in which various aspects of the present invention may be incorporated.

FIG. 2A shows one implementation of a NOR Flash cell.

FIG. 2B shows another implementation of a NOR Flash cell.

FIG. 3 shows a diagram a string of NAND Flash cells.

FIG. 4 shows an array of NAND memory cells.

FIG. 5 shows a floating gate memory cell.

FIG. 6 shows an array of dual floating gate source side injection (DFGSSI) configuration Flash memory cells.

FIG. 7 shows a circuit diagram of a current-limited latch.

FIG. 8 shows a column of current-limited latches connected in parallel and interfacing with an array of memory cells.

FIG. 9 shows an alternative embodiment for a parallel configuration of current-limited latches.

FIG. 10 shows a cross section of an example of a deep n-well device NMOS device.

FIG. 11 shows a cross section of an example of a triple n-well PMOS device.

FIG. 12 shows a partitioned array and latches.

FIG. 13 shows pass gate circuits.

FIG. 14 shows an embodiment of a current-limited supply.

DETAILED DESCRIPTION OF THE INVENTION

FIG. 1 generally shows an electronic system, such as a computer system, in which various aspects of the present invention may be incorporated. Some examples of electronics systems include computers, laptop computers, handheld computers, palmtop computers, personal digital assistants (PDA), MP3 and other audio players, digital cameras, video cameras, electronic game machines, wireless and wired telephony devices, answering machines, voice recorders, and network routers.

This electronic system architecture includes a processor or microprocessor 21 connected to a system bus 23, along with random access, main system memory 25, and at least one or more input-output devices 27, such as a keyboard, monitor, modem, and the like. Another main computer system component that is connected to a typical computer system bus 23 is an amount of long-term, nonvolatile memory 29. In contrast to volatile memory such as DRAM (dynamic RAM) or SRAM (static RAM), nonvolatile memory retains its stored state even after power is removed from the device. Typically, such a memory is a disk drive using magnetic or optical technology with a capacity of megabytes, gigabytes, or terabytes of data storage. This data is retrieved into the system volatile memory 25 for use in current processing, and can be easily supplemented, changed, or altered.

One aspect of the invention is the substitution of a specific type of semiconductor memory system for the disk drive but without having to sacrifice nonvolatility, ease of erasing and rewriting data into the memory, speed of access, low cost and reliability. This is accomplished by employing an one or more electrically erasable programmable read only memories (e.g., Flash or EEPROMs) integrated circuits. Integrated circuits are sometimes called chips. This type of memory has additional advantages of requiring less power to operate, and of being lighter in weight than a hard-disk drive magnetic media memory, thus being especially suited for battery-operated portable computers. Such nonvolatile semiconductor memories include Flash disk drives, CompactFlash (TM) cards, SmartMedia (TM) cards, personal tags (P-Tag), multimedia cards, secure digital (SD) cards, and memory sticks (R).

The bulk storage memory 29 is constructed of a memory controller 31, connected to the computer system bus 23, and an array 33 of Flash or EEPROM integrated circuit chips. Data and instructions are communicated from the controller 31 to the Flash or EEPROM array 33 primarily over a data line 35. Similarly, data and status signals are communicated from the Flash or EEPROM 33 to the controller 31 over data lines 37. Data lines 35 and 37 may be serial or parallel, depending on the implementation. Other control and status circuits between the controller 31 and the EEPROM array 33 are not shown in FIG. 1.

The nonvolatile memory integrated circuits may also be combined with other integrated circuits or components such as controllers, microprocessors, random access memories (RAM), or I/O devices, to form a nonvolatile memory system. The controller and memory may be on separate integrated circuits or a memory integrated circuit may incorporate the controller. The memory may reside on multiple, separate integrated circuits. For example, multiple memory integrated circuits may be combined to obtain larger memory sizes.

Further discussion of Flash EEPROM systems and nonvolatile cells and storage is discussed in U.S. Pat. No. 5,602,987, U.S. Pat. No. 5,095,344, U.S. Pat. No. 5,270,979, U.S. Pat. No. 5,380,672, U.S. Pat. No. 5,712,180, U.S. Pat. No. 5,991,517, U.S. Pat. No. 6,222,762, and U.S. Pat. No. 6,230,233, which are incorporated by reference along with all other references cited in this application.

A memory integrated circuit of a nonvolatile memory system will include a number of memory cells, each of which holds at least one bit of data. Multistate memory cells may also be used, which will allow storage of multiple bits of data in each cell. For example, each memory cell may store two, three, four, five, six, seven, eight, or more bits of data per cell. Memory cells capable of storing multiple bits of data may also be referred to as multilevel cells.

Some types of nonvolatile storage or memory cells are Flash, EEPROM, and EPROM, which are all floating gate type memory cells. The invention may also be applied to other types of memories such as phase-change cells, magnetic cells (MAAM), ferroelectric cells (FRAM), magnetic ferroelectric, and many others.

The memory cells are typically arranged in an array in rows and columns. There may be multiple arrays per integrated circuit. Individual cells are accessed by row and column. Two different organizations for the memory cells are NOR and NAND configurations. The invention is applicable to these configurations as well as other configurations of memory cells.

FIG. 2A shows an example of a nonvolatile memory cell for a NOR configuration. In this specific NOR configuration, there is a select or read transistor 211 connected in series with a memory transistor 215 between a drain line (DL) and source line (SL). The drain line may also sometimes be referred to as a bit line (BL) of the cell. The read transistor has a gate connected to a row line (RL) or word line (WL), and the memory transistor has a control gate connected to a control gate (CG) line. The CG line may be referred to as a control line or steering line. Depending on the particular implementation or operation, the drain line and source line may be interchanged or swapped. In particular, the figure shows the drain line is connected to the read transistor and the source line is connected to the memory transistor. However, in another implementation, the source line may be connected to the read transistor and the drain line may be connected to the memory transistor.

For example, if the word "source" is reserved for that electrode that is at a lower potential than the drain, then during read operations the line that is connected to the drain of the select transistor is the drain line, and the line that is connected to the source of the memory cell transistor is the source line. The situation is reversed for programming, where the higher voltage is applied to the memory cell side to achieve source side injection.

For an array of NOR memory cells, a number of NOR cells will be connected to the drain line (or source line). This will typically be referred to as a column of the array. Each cell of the column will have a separate word line or row line, which will typically referred to as a row of the array.

In an implementation, both read and memory transistors are n-channel or NMOS type transistors. However, the devices may be other types of transistors including p-channel or PMOS type transistors and others. The read device 211 may be a different device type from the memory device 215. In a specific implementation, the memory device is a floating gate device such as a Flash, EEPROM, or EPROM transistor. However, the memory device may be another type of device such as a phase-change, NRAM, FRAM, magnetic ferroelectric, FeRAM, NROM, MNOS, SONOS, or other device.

FIG. 2B shows another example of a nonvolatile memory cell for a NOR configuration. There is a single memory transistor 222. This configuration is similar to the one in FIG. 2A, but does not include a select or read transistor. This configuration may be more compact than the FIG. 2A configuration because it has only a single transistor.

FIG. 3 shows nonvolatile memory cells in a NAND configuration. In the NAND configuration, there are a number of memory transistors 311 connected in series between a drain select device 315 and a source select device 319, between a drain line (DL) and source (SL). This is a column of memory cells, and multiple columns of these cells may be used to form an array of NAND memory cells. The column of memory cells is sometimes referred to as a NAND chain or string. These can be any number of cells in a NAND string. In a specific implementation, there are at least sixteen memory cells in a NAND chain. Each memory transistor has a gate connected to an individual word line (WL). The word lines may be labeled WL1 to WLn, where n is the number of memory cells in a particular column. The drain select device has a gate connected to a drain select line (DSEL), and the source select device has a gate connected to a source select line (SSEL). Depending on the particular implementation, the drain line and source line may be interchanged or swapped.

In an implementation, the source select transistor, drain select transistor, and memory transistors are n-channel or NMOS type transistors. However, the devices may be other types of transistors including p-channel or PMOS type transistors and others. The drain select device and source select device may be a different device type from the memory device 311, and different from each other. In a specific implementation, the memory device is a floating gate device such as a Flash, EEPROM, or EPROM transistor. However, the memory device may be another type of device such as a phase-change, NRAM, FRAM, magnetic ferroelectric, FeRAM, NROM, MNOS, SONOS, or other device.

FIG. 4 shows an array of NAND memory cells. The are n rows and m columns of memory cells, where n and m are positive integers. Each column has n memory cells connected to word lines WL0 to WLn. The columns of memory cells are labeled BL0 to BLn. Each column has n memory cells, which are connected between a drain select device and a source select device. And, the drain and source select devices are in turn connected to the drain line (DL) or bit line (BL) and the source line (SL). Gates of the drain select device are connected to the drain select line (DSEL) and gates of the source select device are connected to the source select line (SSEL). A particular cell or selected cell may be accessed by using the appropriate word line and bit line, and applying the appropriate voltages to those lines.

FIG. 5 shows a representative floating gate nonvolatile memory device, which may be used in any of the previously described memory cells and arrays. Further description of floating gate devices may be found in U.S. Pat. No. 5,991, 517. The floating memory cell has a drain (D), source (S), control gate (CG), and floating gate (FG).

In brief, a nonvolatile memory cell is one that retains its stored state, even when power is removed. Some examples of floating gate type memory cells include Flash, EEPROM (also known as $E^2$ or E-squared), and EPROM. A Flash and EEPROM cell is electrically erasable and electrically programmable. An EPROM cell is electrically programmable, and erasable using ultraviolet (UV) light. A floating gate device is programmed or erased by subjecting appropriate nodes to high voltages. These high voltages cause electrons to be added to or removed from the floating gate, which will adjust the threshold voltage or VT of the floating gate device. Some physical mechanisms for causing electrons to move to or from floating gate are hot-electron injection, Fowler-Nordheim tunneling, or band-to-band tunneling.

The high voltage used to program the device is sometimes referred to as the VPP voltage, and the high voltage used to erase the device is sometimes referred to as the VEE voltage.

The VPP voltage will vary depending on the process technology and the particular implementation. In a particular implementation, VPP ranges from about 6.5 volts to about 20 volts. In some specific implementations, VPP ranges from 12 volts to 18 volts. The VEE voltage will vary depending on the process technology and the particular implementation. In a particular implementation, VEE ranges from about −12 volts to about −25 volts. In some specific implementations, VEE ranges from −12 volts to −15 volts. In some implementation, the programming voltages may be generated by on-chip circuitry, such as charge pumps or other voltage generator circuits, and in other implementations, the programming voltages may be supplied from a voltage source, external to the integrated circuit.

The floating gate nonvolatile memory device may store a single bit (0 or 1) or multiple bits (e.g., two bits: 00, 01, 10, and 11; or three bits: 000, 001, 010, 011, 100, 101, 110, and 111, or four bits: 0000, 0001, 0010, 0011, 0100, 0101, 0110, 0111, 1000, 1001, 1010, 1011, 1100, 1101, 1110, and 1111). U.S. Pat. No. 5,991,517 discusses further some aspects of single bit and multibit cells. In short, the memory cell will have an erased state and one or more programmed states.

An erased state is when the VT of the device is such that it is off for voltages from about ground to VCC. In other words, erase refers to configuring the floating gate device to have a VT (threshold voltage) of, for example, 0 volts or below. When erased, the floating gate transistor does conduct current even when 1 volt is placed on its gate (i.e., control gate). All the floating gate cells of an integrated circuit may be initialized to an erased state. Furthermore, in an embodiment, the memory cell may need to be erased before it can be programmed.

Erasing occurs by removing electrons from the floating gate of the floating gate transistor. One technique to do this is to ground the control gate and to place the VEE voltage at the drain or the source, or both. The VEE voltage attracts the negatively charged electrons from the floating gate, because they are attracted to the positive voltage. Another technique is to apply a voltage at the drain or source, or both. A more negative voltage (may be referred to as a negative VEE voltage) is applied at the gate. For example, in one embodiment, 2 volts is applied to the source or drain and −19 volts is applied to the control gate.

Generally, erasing occurs by the electrons tunneling out of the floating gate. The time it takes to erase the device depends on various factors including the voltage magnitude difference between the control gate and the source or drain. Generally, the greater the voltage difference, the faster the device will become erased because the electrons will be more strongly attracted to the more positive voltage. However, it is desirable that the VEE voltage is selected so that it does not damage the cell and also allows erase of the selected cell, without disturbing the stored states of adjacent and other memory cells (when in an array).

When storing only one bit, the floating gate device will have in addition to the erased state, only one programmed state. For purposes of this application, a programmed state for a single bit cell is typically when the VT of the device is higher than a designated positive value.

For a multistate cell, the VT is set at specific voltage level indicating it is in a particular state. In other words, depending on what the programmed VT state is, this will indicate a particular stored binary value. For an example of a two-bit memory cell, a VT of 1 volt, plus or minus 0.25 volts may indicate a 01 binary state. A VT of 2 volts, plus or minus 0.25 volts, may indicate a 11 binary state. And a VT of 3 volts, plus or minus 0.25 volts, may indicate a 10 binary state. In this example, Gray coding is used so that with state changes, only one bit changes at a time. In other implementations, other coding techniques may be used.

Programming occurs by adding electrons to the floating gate of the floating gate transistor. Generally, one technique to do this is to place VPP at the control gate and to place ground at the drain or the source, or both. The VPP voltage attracts the negatively charged electrons into the floating gate, because they are attracted to the positive voltage. Using this technique, the electrons tunnel into the floating gate.

Generally, another technique is to place a VPGG voltage (which is a high positive) at control gate and cause a current to flow across the floating gate device's channel region (such as placing 6 volts at the drain and grounding the source). Then hot electrons from the current flow will be attracted and become embedded into the floating gate.

More specifically, to program memory cells, there are two mechanisms, tunneling and hot electron injection. For multistate programming, each write operations includes a sequence of program pulses, each of which is followed by a verify operation.

Channel hot electron injection has both hot electron production and hot electron injection. To produce hot electrons a large lateral field in required. This is provided by a high drain to source voltage. To inject the hot electrons onto the floating gate, a large vertical electric field is used. This electric field is provided by the control gate voltage which in turn couples some of its voltage to the floating gate. In drain side injection, the high vertical field needed for hot electron injection has the side effect of reducing the high lateral field needed for hot electron production. Source side injection does not suffer from the same dilemma, and therefore is more efficient. In both source side and drain side injection, a scattering mechanism is required to divert the momentum of electrons traveling laterally through the channel, so that a lucky few will be scattered vertically towards the floating gate. The normal hot electron impingement that is an innovative feature of this cell, may increase the programming efficiency beyond the improved efficiency of source side injection because the majority of hot electrons will have a momentum that will aid them in surmounting the silicon and silicon oxide energy barrier. It will no longer be necessary for the hot electrons to scatter into a direction that would aid them in surmounting the silicon and silicon oxide energy barrier.

Another mechanism for programming would be Fowler-Nordheim tunneling, as is used in NAND technology. But to use tunneling typically entails giving up the potential benefits of the previously discussed mechanism. Tunneling is generally very slow in comparison to hot electron injection. In the case of tunneling, performance has to be maintained by programming larger numbers of cells in parallel at a cost of larger numbers of peripheral programming blocks.

During each programming pulse the drain voltage is maintained at a constant value in a range from about 3 volts to 6 volts. The control gate voltage for the first programming pulse will have some positive starting value that need to be characterized, and may be adaptively determined even in the field. The transfer gate voltage is a constant envisioned to be in a range from about 6 volts to 10 volts. The select gate or word line voltage is envisioned to be in a range from about 3 volts to 10 volts. The select transistor's threshold voltage would preferably be high enough to shut off any current paths through unselected cells, which prevents disturbing the states of the unselected cells. This is because the optimum select gate voltage for the most efficient source side injection is less than a volt higher that the select gate threshold voltage. For the DFGSSI cell (described below), the drain for programming will be the bit line just adjacent the cell, and the source for programming will be the other bit line residing just to the other side of the drain. It should be noted that the roles of the two bit lines reverses for the read or verify operation where the adjacent bit line to the floating gate is the source. In this naming convention source is that electrode with a lower voltage as compared to the drain. The source voltage for programming may be adaptively controlled by a current limiter such that the instantaneous programming current does not exceed some designated value.

The movement of charge into and out of the floating gate is determined by an electric field magnitude across the tunneling dielectric (which is the gate oxide between the floating gate and channel region): generally the higher the voltage difference between the control gate or the floating gate and the source, the higher the charge transfer into the floating gate. The time it takes to program the device depends on various factors including the voltage magnitude difference between the VPP voltage on control gate. One should note during the programming, the control gate voltage is not necessarily precisely at VPP. VPP is a constant voltage output of a particular charge pump.

Generally, the greater the electric field, the faster the device will become programmed because the electrons will be more strongly attracted to the VPP voltage. However, it is desirable that the maximum programming control gate voltage and the maximum programming drain voltage are selected so that they do not damage the cell and also allow programming of the selected cell, without disturbing the stored states of adjacent and other memory cells (when in an array) on the same control line, bit line, or word line. Further, when the cell is a multistate cell, it may be desirable that the VPP voltage is selected so it allows sufficiently fine resolution in programming the device to the desired VT. For example, the VPP voltage may be applied in pulses so that the devices don't become programmed to too much (i.e., programmed to a VT level above their intended VT level).

FIG. 6 shows an array of storage elements or memory cells 605 arranged in rows and columns. An array of such memory cells or storage elements may be of any desired size, and is likely to have significantly greater numbers of cells than the example shown in the figure. This memory cell or storage element configuration may be referred to as dual floating gate source side injection (DFGSSI) cell. This cell may also sometimes be referred to as a high efficiency (HE) memory cell. In a specific embodiment, the storage elements include Flash memory cells. There are two memory devices (e.g., Flash memory cells) in each storage element. In an embodiment, storage element 605 is a multistate storage element. Different types of memory cells and memory technologies may be used to implement this storage element. Multistate cells and storage elements are described in more detail in U.S. Pat. No. 5,712,180. The storage elements of an array may be arranged in different configurations. For example, the bit lines (BL) and word lines (WL) may be run in directions different from what is shown in the figure.

The storage element has a select gate line 609, a right control gate line 611, and a left control gate line 613. The right control gate line is connected to a gate or control electrode of a right floating gate transistor (TFGR) 615, and the left control gate line is connected to a gate of a left floating gate transistor (TFGL) 617. The select gate line (word line) is connected a gate of a select transistor (TSEL) 619.

For each storage element 605, there are two floating gate transistors or cells 615 and 617 to store binary data. Each of these floating gate transistors may store a single bit or multiple bits of data. When storing multiple bits of data, each floating gate cell may also be referred to as a multistate, multilevel, or multibit cell, because the cell may be programmed to have more than two VT (threshold voltage) levels. For example, each floating gate transistor may store two bits per cell, four bits per cell, or an even greater number of bits per cell.

Floating gate transistors are selectively configured by placing appropriate voltages on bit lines BL1 and BL2, control gate lines 613 and 611, and select lines 609. The drains and sources of the transistors are connected to bit lines BL1 and BL2, which may be selectively connected to ground, or any another constant voltage or constant current source through transistors 628 and 632. At edges of each control gate segment, every pair of control gate lines can be merged into one electrode in order to fit their control line segment select transistors in the pitch of two floating gates as opposed to the pitch of one floating gate cell as shown in FIG. 6. For proper device operation it is essential that the two control lines that form each merged line are on opposing sides of a single bitline as shown in FIG. 6. If a pair of control lines are merged on top of a segment and then connected to a control line segment select transistor, then a neighbor pair of control lines can be merged on the bottom of a segment and connected to a segment select transistor on the bottom of the segment.

The array may be organized and subdivided into sectors of cells. This will allow erase of entire sectors of cells at a time, rather than the entire array at once. For example, a sector may contain 512 user bytes. A four-bit-per-cell implementation will have at least 1024 cells per sector. More cells are typically required for error checking and correction (ECC), tracking cells, rotation state, and other features.

In operation, data is read from a selected cell by using the word lines, bit lines, and steering (control) lines when we read TFGR cell 615. Line 609 which is connected to the select gate is biased at 5 volts. CG line 611 is biased at a sense voltage. Line 613 is biased at overdrive level 7 volts to make sure cell 617 is on. And BL1 is at about 1 volt or about 1.5 volts. DL2 is at 0 volts or VSS. Then whether cell 615 conducts or not determines the voltage level on BL1.

In a specific embodiment, the current-limited latch of the invention will be described with respect to the specific storage element structure shown in FIG. 6, where there are two floating gate transistors per element. However, the invention may be used in any integrated circuit requiring a nonvolatile storage element. For example, the invention may be used for storage elements where there is a single floating gate transistor per element. There may be a single floating gate transistor and a single select transistor in each cell. The current-limited latch may be used with memory cells or storage elements organized in NOR or NAND arrangements described above, or may be used with any other circuitry repeated in a similar pitch as the latch.

The latch of the invention is applicable to integrated circuits where mixed voltage levels are used on-chip, not just for memory integrated circuits. The invention may be used in any logic integrated circuit or mixed signal integrated circuit having both analog and digital circuit portions, just to name some examples.

FIG. 7 shows a circuit diagram of a specific embodiment of a current-limited latch of the invention. In an embodiment, this latch is used in a nonvolatile memory integrated circuit such as a Flash memory, where the latch is used for decoding the array of cells. For example, the latch may be used to determine (e.g., via a stored value in specific latches corresponding to certain cells) which memory cells to program, read, or erase. In a specific embodiment, a number of current-limited latches are connected in parallel. The parallel latches are connected to an array of DFGSSI cells, such as shown in FIG. 6.

The circuitry includes a latch portion 702, which has an upper supply pull-up circuit 706 and a lower supply pull-down circuit 709. This application provides some specific sizes of the devices, specific voltage levels, and other specific parameters for a specific implementation of the invention. However, it is understood that other sizes, voltages, and parameter values may be used in other implementations of the invention. For example, the sizes of the transistors may be adjusted to obtain a desired or appropriate result or to operate properly in a particular process.

The latch has two NMOS transistors 704 and 705, where gates of both devices are connected to a VB2 voltage line. In an embodiment, VB2 may be 3 volts of −5 volts, switching between the two as needed. Further in this specific embodiment, both transistors are the same size, having a width/length (W/L) of 32.2/4, where the values are given in microns. Transistors 704 and 705 are included in the embodiment in the figure, but may be removed or optional in other embodiments.

Transistors 704 and 705 are primarily used to protect the other devices, transistors in the lower supply pull-down circuit, from high voltages seen at ER and ERb. Transistors 704 and 705 will help prevent punch through of transistors N13 and N14. Specifically, transistors N13 and N14 of the lower supply pull-down circuit have a breakdown voltage (sometimes referred to as BVDSS). In a specific embodiment, BVDSS for an n-channel device is about 14 volts and for a p-channel device is about 24 volts. Therefore, it is important transistors N13 and N14 are not subjected to the BVDSS voltage or a voltage close to BVDSS. The voltage at ER and ERb is placed across two n-channel devices in series so the drain-to-source for transistors N13 and N14 is reduced, ensuring the voltage is below BVDSS. Specifically, transistors 705 and N13 ate in series, and transistors 704 and N14 are in series. However, depending on the BVDSS which is governed by the process technology, transistors 704 and 705 may not be needed.

The latch also has two PMOS transistors 714 and 715, both having a W/L of 39/10. These PMOS transistors connect the latch to ERSEL and ERSELb lines, which are complements of each other. By using these lines, data may be stored into the latch as desired. PMOS type devices are used so that negative voltages do not pass through. In particular, transistors 714 and 715 block voltages at ER1 and ER1B from passing through to ERSEL and ERSELb respectively. At ERSEL and ERSELb are inverter drivers, which in an embodiment is driven using a 3-volt supply. Voltages at ER1 and ER1*b* may be 12 volts or negative at different times of the operation. Transistors 714 and 715 prevent the voltages at ER1 and ER1*b* from passing through to damage transistors 714 and 715.

Connected to ERSEL and ERSELb are logic gates governed by input signals ERSEbC, SSELb, and N10SWbH. Circuit block 722 is a voltage level shifter, which may change the signal level from one voltage level to another. The following table A gives the ERSEL and ERSELB outputs based these signals.

connected to VCC12. In an embodiment, VCC12 may be 12 volts or 10 volts, switching between the two as needed. VCC12 may be provided by an on-chip voltage pump circuit, but may also be provided from an source external to the integrated circuit or supply. Further in this specific embodiment, both PMOS transistors are the same size, having a W/L of 6/10. VCC12 is supplied by a current limited source circuit. The current limiter limits the current to about 10 microamps at about 12 volts. The current limited amount may be adjusted by changing the size of the devices in the current limiter circuit. For example, making the current lower will make the latch slower, but reduce current drain. The current limiter may limit the current to any desired value. For example, the current limiter may limit current to 100 microamps or less. The less current means the less power that will be consumed, but typically the performance decreases too.

The lower supply pull-down circuit has two NMOS transistors, both having sources connected to a lower voltage supply line VEE5. VEE5 may be −5 volts or −20 volts, switching between the two as needed. VEE5 may be provided by an on-chip voltage pump circuit or supply, but may also be provided from a source external to the integrated circuit.

The well connections for the devices are connected to a DNW1 line. In this specific embodiment, both NMOS transistors are the same size, having a W/L of 5.8/10. VEE5 is provided by a current limited supply, which limits the current to about 10 microamps at about −5 volts. The current limiter may limit the current to any desired value. For example, the current limiter may limit current to 100 microamps or less. The less current means the less power that will be consumed, but typically the performance decreases too.

FIG. 7 shows some specific current-limited latch circuit configurations. However, in other embodiments of the invention, other current-limited latch circuit configurations may be used. The configurations in FIG. 7 do have an advantage of having only a couple devices, and the devices are relatively small or compact with any level of input signals. This is especially important in cases where the latch is replicated numerous times on an integrated circuit.

In operation, the latch as described in FIG. 7 is designed to store either 12 volts or −20 volts. These voltages are used for programming or erase of the cells. Essentially, such a latch could be called a level switch. For example, FIG. 9 shows a number of these latches, L1, L2, L3, and L4, connected in parallel between an upper supply line 808 and lower supply line 810. Each latch may include the circuitry in box 702 of FIG. 7. These latches are used to program, erase, or hot program a corresponding group of memory cells to which the latches are connected. The memory cells

TABLE A

| Mode | ERSEbC | SSELb | N10SWbH | ERSEL | ERSELb | ER | ERb | VB2 |
|---|---|---|---|---|---|---|---|---|
| Setup | 3 V | 0 V (selected) | 3 V | 0 V | 3 V | −5 V | 12 V | 3 V |
| Normal | | 1.8 V (unselected) | | 3 V | 0 V | 12 V | −5 V | 3 V |
| Midstage | 0 V | 0 V (selected) | 0 V (after | 3 V | 0 V | 0 V | −5 V | 3 V |
| of Erase | | 1.8 V (unselected) | ERSEb low) | 0 V | 3 V | −5 V | 0 V | 3 V |
| Erase | 0 V | 0 V (selected) | 0 V | 0 V | 0 V | 0 V | −20 V | −10 V |
| | | 1.8 V (unselected) | | 0 V | 0 V | −20 V | 0 V | −10 V |

The upper supply pull-up circuit has two PMOS transistors, both having sources connected to an upper voltage supply line VCC12. The well connections for the devices are may be arranged in a column or row of an array of such cells. The appropriate voltage is stored in L1, L2, L3, and L4 to place the corresponding memory cells into the desired state.

In an embodiment, the FIG. 7 circuitry will work for multiple voltage logic. For example, the circuitry works for both 3-volt and 1.8-volt logic. This allows more flexibility in the conditions under which the current-limited latch of the invention may be utilized.

In an embodiment, all logic gates are operated at a 3-volt supply. One mode is a decoding or set latch mode. When SSELb is 0 volts, this means this latch is selected. During this mode, N10SWbH is 3 volts and ERSELbC is 3 volts, so that ERSEL is 0 volts and ERSELB is 3 volts. In read/ program operations, the signals N10SWbH and ERSEbC remain high (3 volts) so that ER is −5 volts and ERb is 12 volts. Then an associated memory cell M1, M2, M3, or M4 will pass p2pos (0:3) to the array to achieve the read or program operation. In erase operation, after the latch was set and the erase command was recognized by the state machine, ERSEbC is 0 volts. So the latch changes its setting, selected latch ER is 12 volts, and ERb is −5 volts so select CG<X>(p2<X.) will pass −20 volts to the array to erase operation perform when the state machine enables a −20-volt pump. VB2 changes its level from 3 volts to −10 volts. VCC12 changes its level from 12 volts to 0 volts. VEE5 changes its level from −5 volts to −20 volts. During a decode mode, program mode, or read mode, VCC12 is 12 volts and VEE5 is −5 volts. During an erase mode, VCC12 is 0 volts and VEE5 is −20 volts. Supply voltages for the latch are summarized in table B below.

TABLE B

| MODE | VCC12 | VEE5 | VB2 |
| --- | --- | --- | --- |
| DECODE, PROGRAM, READ | 12 volts | −5 volts | 3 V |
| ERASE | 0 | −20 | −10 V |

FIG. 8 shows a number of latches as they are connected to an array of memory cells. As discussed above, the array of memory cells is organized in row and columns. In the figure, there are two arrays of memory cells 803 and 805. This example shows two arrays of memory cells, but in other embodiments there can be any number of arrays. For example, there may be single array or there may be more than two arrays.

Each array has n+1 rows, where n is an integer. There are n+1 word lines, WL0 to WLn. At an end of each array, a latch of the invention is connected to the array. A group of 64 rows of memory cells is called a segment. In this embodiment, each latch is laid out in the same pitch as one segment of memory cells. In this embodiment, a segment is defined as 64 rows of memory cells. However, in other embodiments, there can be any number of memory cell rows (or word lines) per segment, such as 1, 2, 8, 16, 32, 80, 128, and others. Since there are two arrays, there are two latches. In other embodiments, two latches may be placed into one block, adjacent to both arrays, instead of two blocks.

There are a number of latches connected in parallel. Each latch in column 807 is connected to an upper current-limited supply line 808 and lower current-limited supply line 810. Supply FIG. 9 shows a more detailed diagram of the connections between four parallel latches L1, L2, L3, and LA between supply lines 808 and 810. Each latch in FIG. 9 is connected to place voltages to drive control gates for a segment of memory cells, which in a specific embodiment is 64 word lines.

There is one upper current limiter circuit 908 and one lower current limiter circuit 918 for the latches in the column. The latches share the upper current limiter and lower current limiter. The latches and current limiters are between pumps (or voltage sources) A and B. In other embodiments of the invention, there may be a single pump (or voltage source) connected to the current limiter circuits, instead of two pumps (or voltage sources). The latches L1, L2, L3, and L4 may be formed close or adjacent to the array of memory cells, while the current limiter circuitry may be farther away from the array. This figure shows a separate pump or source of current limiter circuit. However, in other embodiments, these may be integrated or the same circuitry.

There may be any number of latches, not only four as shown in the figure. For example, there may be 2, 3, 4, 8, 16, 20, 23, 58, 62, 128, 256, or more latches. There may also be any number of memory cells. In a specific embodiment, there will be one latch for each segment of rows of memory cells. Programming may proceed line by line (e.g., row by row, column by column, sector or sector) by connecting the appropriate or corresponding latch to the control lines of a selected memory cell. Each of the memory cells may be Flash or EEPROM cells, or other type of nonvolatile cells, some of which were listed above.

The FIG. 8 parallel configuration of current-limited latches saves power, but still gives reasonable speed or performance. Pumps which are current limited are typically connected to lines 808 and 810 to provide pumped high voltages (positive or negative, or both). By using the current-limited latches, the pump can output to other circuits (other than the latches) without having too much current drained by the latched during state changes of the latch. Further, pump noise will be reduced, minimizing noise effects on data and other circuits.

Since one intended use of these latches is for decoding during programming or erase of Flash or other nonvolatile memory cells, they do not need to be very fast. But there are typically many latches like these on a single integrated circuit, all operating at the same time. It is important that each consumes relative low power. It is important that each latch uses a minimal amount of integrated circuit area. Also, with many latches switching at the same time, this may cause an amount of noise. By current limiting the latches, this reduces the amount of noise. If these current limited latches are used in other embodiments, they can be designed to achieve or obtain the desired benefits. The input of the latch can be any level or any polarity of the voltages.

A further benefit of the parallel configuration of current-limited latches of FIGS. 8 and 9 is that it is relatively easy to adjust the trip point of all the latches at the same time, which may be necessary, for example, to compensate for process skew. The trip of the latch is the voltage at which the latch will switch from one stable stored state to another stable stored state. The trip point for all the latches may be adjusted by adjust the voltage at line 808 or line 810, or both. During a switch, the voltages at 808 and 810 will move toward each other, and then change state. This makes the trip point more insensitive to process variations.

In an embodiment, because of the range of voltages used (both positive and negative), the NMOS transistors used in the latch 702 of FIG. 7 are deep n-well devices and the PMOS transistors are triple n-well devices. FIG. 10 shows a cross section of an example of a deep n-well device NMOS device. A transistor is formed in a p-well of a deep n-well on a p-type substrate. The transistor has n+ diffusion regions and a gate.

FIG. 11 shows a cross section of an example of a triple n-well PMOS device. A transistor is formed in a deep n-well of a p-type substrate. The transistor has p+ diffusion regions formed in p-well regions of the deep n-well. There are also n+ and n-well regions to provide contacts to the deep n-well region. These serve as the body connection for the transistor. Triple n-well devices help prevent latch-up and other potential problems when using negative voltages in an integrated circuit. If negative voltages are not used, triple n-well devices may not be needed.

In a specific embodiment, for the latch, the NMOS devices or transistors are deep n-well devices and the PMOS devices or transistors are triple n-well devices. In such a case, a DNW2 line provides a voltage to the deep n-well region of the devices.

FIG. 12 shows an embodiment of a memory array with latches, where the memory array is further partitioned. A latch is associated with each. This embodiment is similar to that in FIG. 8, except each word line has been divided into four portions, which may be referred to as banks. Each portion is connected to a separate control gate (CG) lines. For example, each bank includes 64 cells. However, in other embodiments, there may be any number of cells in each bank, more or less than 64. Also, each bank may include a different number cells than every other segment, or one or more banks may have a different number of cells than the others. Bank 0 is connected to CG0, bank 1 is connected to CG1, bank 2 is connected to CG2, and bank 3 is connected CG3.

To handle a partitioned array, each latch of the invention includes four pass gates or switches, shown in FIG. 13. The pass devices are laid out in the same pitch as the latch. The four pass gates are 1208, 1218, 1228, and 1238. Each latch has the same circuitry as the others. However, in other embodiments, each pass gate may have different or slightly different circuitry. For an undivided array or one having a single bank, there may be only one pass gate. Generally there will be one pass gate for each bank. ER and ERb from the latch will be connected to the ER and ERb inputs (labeled) for each of the four pass gates. Outputs of the pass gates are P2<0>, P2<1>, P2<2>, and P2<3>, which will be connected to a control gate lines for each bank (i.e., CG0, CG1, CG2, and CG3) as appropriate. The pass gates pass or not pass the bias voltages to the array to obtain the desired operation. The bias voltages are dependent on P2POS<3:0> and P2NEG<3:0>. Bus P2POS<3:0> has a respective upper supply line for each of the four latches. Bus P2NEG<3:0> has a respective lower supply line for each of the four latches. The bias voltages for various operations was discussed above.

FIG. 14 shows a embodiment of current-limited supply for a latch of the invention. VEE5_U, VEE5_D, or VEE5A is connected to the VEE5 supply input of a latch. VCC12_U or VCC12_D is connected to the VCC12 supply input of the latch. There are multiple VCC12 and VEE5 sources generated because different sources may be used for a different group of latches. However, as the circuit diagram indicates, VEE5_U, VEE5_D, or VEE5A are in parallel, and VCC12_U or VCC12_D are in parallel, so they operate similarly.

In brief, the circuitry provides current-limited supplies. The magnitude of the current may be adjusted by changing the size of the transistors. For example, a transistor connected to VEE5_U has a W/L of 20/8. By altering this size, the amount of the current may be adjusted as desired. Similarly, VCC12_U and VCC12_D may be adjusted.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. An integrated circuit for storage of data comprising:
   an array of nonvolatile memory cells;
   a plurality of latch circuits coupled to the array of nonvolatile memory cells, the plurality of latch circuits connected in parallel between an upper supply line and a lower supply line, an individual one of the plurality of latch circuits including a pull-up circuit block connected to the upper supply line and a pull-down circuit block connected to the lower supply line;
   a first current limiter circuit connected to the upper supply line;
   a first current source connected to the first current limiter circuit, the first current limiter circuit interposed between the first current source and the upper supply line to limit a first current from the first current source to the upper supply line;
   a second current limiter circuit connected to the lower supply line; and
   a second current source connected to the second current limiter circuit, the second current limiter circuit interposed between the second current source and the lower supply line to limit a second current from the second current source to the lower supply line.

2. The integrated circuit of claim 1 wherein the plurality of latch circuits are dedicated to a segment of the memory array.

3. The integrated circuit of claim 2 wherein the segment of the memory array consists of sixty-four rows of memory cells.

4. The integrated circuit of claim 1 wherein the array of nonvolatile memory cells is a NAND array.

5. The integrated circuit of claim 1 wherein the array of nonvolatile memory cells is arranged in rows and columns and individual rows are further divided into a plurality of banks of memory cells.

6. The integrated circuit of claim 5 further comprising a plurality of pass gates, each pass gate corresponding to a bank of memory cells.

7. The integrated circuit of claim 1 wherein individual cells of the nonvolatile memory array contain more than one bit of data.

8. An integrated circuit for storage of data, comprising:
   an array of nonvolatile memory cells arranged in rows and columns, a row of cells divided into a plurality of banks of cells, a bank being individually selectable; and
   a plurality of latch circuits coupled to the array of nonvolatile memory cells, the plurality of latch circuits connected in parallel between an upper supply line and a lower supply line, an individual latch circuit including a pull-up circuit block connected to the upper supply line and a pull-down circuit block connected to the lower supply line, an individual latch circuit of the plurality of latch circuits being selectably connectable to individual banks of the plurality of banks of cells, the individual latch circuit connected to a first bank at a first time and connected to a second bank at a second time.

9. The integrated circuit of claim 8 further comprising one or more switches interposed between the plurality of latch circuits and the plurality of banks of cells to allow one of the plurality of latch circuits to be connected to a selected individual bank of cells.

10. The integrated circuit of claim 8 further comprising first current source and a first current limiter providing limited current to the upper supply line and a second current source and a second current limiter providing limited current to the lower supply line.

11. A method of accessing data in a nonvolatile memory array, comprising:
providing a first current to an upper supply line through a first current limiter circuit;
providing a second current to a lower supply line through a second current limiter circuit;
providing a plurality of latches between the upper supply line and the lower supply line, an individual one of the plurality of latches including a pull-up circuit block connected to the upper supply line and a pull-down circuit block connected to the lower supply line; and
connecting the plurality of latches to a portion of the nonvolatile memory array.

12. The method of claim 11 wherein the portion of the nonvolatile memory array is a row of the memory array.

13. The method of claim 11 wherein the portion of the nonvolatile memory array is a section of the memory array that consists of multiple rows.

14. The method of claim 11 further comprising, in a first mode, providing the upper supply line with a positive voltage and, in a second mode, providing the upper supply line with a first negative voltage and providing the lower supply line with a second negative voltage that is more negative than the first negative voltage.

* * * * *